United States Patent

[11] 3,601,523

[72] Inventor Lloyd G. Arndt
St. Paul, Minn.
[21] Appl. No. 47,714
[22] Filed June 19, 1970
[45] Patented Aug. 24, 1971
[73] Assignee Buckbee-Mears Company
St. Paul, Minn.
Continuation-in-part of application Ser. No. 855,703, Sept. 5, 1969, now abandoned.

[54] THROUGH HOLE CONNECTORS
7 Claims, 6 Drawing Figs.

[52] U.S. Cl. .......... 174/68.5, 29/625, 29/628
[51] Int. Cl. .......... H05k 1/04
[50] Field of Search .......... 174/68.5; 317/101 B, 101 C, 101 CM, 101 D; 339/17; 29/625–627, 628; 117/212

[56] References Cited

UNITED STATES PATENTS 3,077,511 2/1963 Bohrer et al. .......... 174/68.5

OTHER REFERENCES

Green, " Printed Circuit Packaging," pub. in IBM Technical Disclosure Bulletin, Vol. 3, No. 12, May 1961, Page 5. Copy in the Scientific Library and Group 215, 174-68.5

*Primary Examiner*—Darrell L. Clay
*Attorney*—Stryker and Jacobson

ABSTRACT: A through hole connector incorporating a low-resistance electrical connection between electrical leads which are located on opposite sides of an insulated layer and a conducting epoxy connector in the hole formed by forcing a conductive adhesive into the hole and compressing a layer of conducting powder onto the adhesive before curing.

INVENTOR
LLOYD G. ARNDT

BY Stryker & Jacobson
ATTORNEYS

THROUGH HOLE CONNECTORS

BACKGROUND OF THE INVENTION

This application is a continuation-in-part of copending application Ser. No. 855,703, filed Sept. 5, 1969, by Lloyd G. Arndt which is now abandoned.

This invention relates generally to electrical circuits and more specifically, to making a low-resistance electrical conductor for connecting electrical leads of electrical circuits that are located on the opposite sides of an insulating layer. The circuit may take any variety of shapes or forms including having a flexible insulating layer or a rigid insulating layer and the circuit can be formed by stamping, etching, electroforming or the like.

DESCRIPTION OF THE PRIOR ART

In an effort to miniaturize the size of the electrical equipment, the electrical circuits have been constructed on opposite sides of the same insulated layer. A typical example of such a circuit is a double-sided printed circuit board where independent electrical circuits are formed on opposite sides of the major surfaces of a supporting layer of insulation. One of the difficulties encountered with this double-sided circuit has been inability to consistently produce reliable connections between the two circuits. Numerous methods and means have been employed to form the connections from one side of the board to the other side of the board. One prior art method teaches placing small eyelets through the insulated layer and then crimping the eyelets on opposite sides against the respective circuits. This method has its disadvantages in that the crimping of the eyelets on opposite sides of the board has not always produced a good electrical connection. Soldering or spotwelding the ends of the eyelets has been used to improve the connection. These methods have been rather costly because of the added steps in handling. These methods are also disadvantageous as the high temperatures in the soldering have oftentimes delaminated the double-sided board at the interconnection points.

Another method involves making connections around the edges of the board, however this produces a bulky unit. This prior art method has primarily been limited to rather large printed circuits and cannot readily be used for the miniaturized electrical printed circuits which are in common use today.

Still another method for making connections through miniature-type circuits involves a process in which a hole is formed through a first conducting member, an insulating layer and a second conducting member. Then an operator fills the opening through the insulating layer with a conductive material through a vacuum deposition process, an electrolysis process or an electroplating process to produce an electrical connection between the conducting members which are located on opposite sides of the insulating layer. While this method has proven reliable for larger sized holes, it has been unreliable for very small holes because of the difficulty in properly circulating the plating solution through these small holes.

An example of the dimensions of some of the connectors used in these miniature printed circuits are 0.001 inches in diameter and 0.001 in length. Because of the surface tension of the liquid and the difficulty in getting the plating solution to deposit the plating material into these miniature holes, a large number of connections formed with this plating process are unsatisfactory because of their relatively high resistance. In addition, the quality of the electrical connections between the electrical circuit on the opposite sides of the insulating layer cannot be checked readily until the unit is removed from the plating system and set up in a testing circuit.

The beat prior art process is some respects involves force filling the hole through the board with a chemically hardening conductive plastic mixture. When the mixture cures, a reliable through hole conductor is formed. However, the resulting conductor is very difficult to join to electrical connectors and shows such a high failure rate that the process has been abandoned by the prior art. The difficulty lies in the fact that conductive plastic mixtures comprise a powdered metal such as silver dispersed in a chemically curing plastic such as epoxy. Even though high percentages of metal are used the epoxy surrounds each grain of metal completely, even those at the surface of the mixture. As a result, virtually none of the conducting metal grains are exposed for electrical connections. Despite this, connections have been attempted by forming a terminal of the surface of the mixture by a painting, plating, or vacuum deposition process. Since the epoxy coating on the metal grains is quite thin and has a low dielectric constant, some few grains of metal will achieve contact with the terminal formed on the surface of the mixture. However, the connection is marginal at best and failures are common.

The present invention overcomes the problem of unreliable or low quality electrical connections between the through hole conductive plastic material and the printed circuits located on opposite sides of an insulting layer. In addition, the present invention allows an operator to visually inspect the connection in order to ensure that it is properly formed. The present invention also eliminates the problems involved with circulating plating solution into connector openings.

SUMMARY OF THE INVENTION

Briefly, a connection is formed between opposite sides of an insulated circuit board by forcing a plastic conductive adhesive through the openings in the electrical leads and the openings in the insulated board. Before the hardening process can occur a powdered metal such as silver is spread over both ends of the mixture. Next, a suitable press is employed to compress both ends of the through hole conductor. This step achieves a critical advantage over the prior art approaches in that the metal powder is forced into a solid conductive layer with a rough, granular, all metal surface which is particularly easy to electrically connect a terminal to by any of the well-known methods. Furthermore, since the compression is done before the epoxy cures, the metal powder is forced into intimate metal to metal contact with the silver powder dispersed throughout the plastic adhesive in the hole. The net result is a very reliable low resistance through hole connector to which terminals can be readily fastened with complete assurance of a solid electrical contact between both sides of the board.

DESCRIPTION OF THE PREFERRED EMBODIMENT

Figure 1:
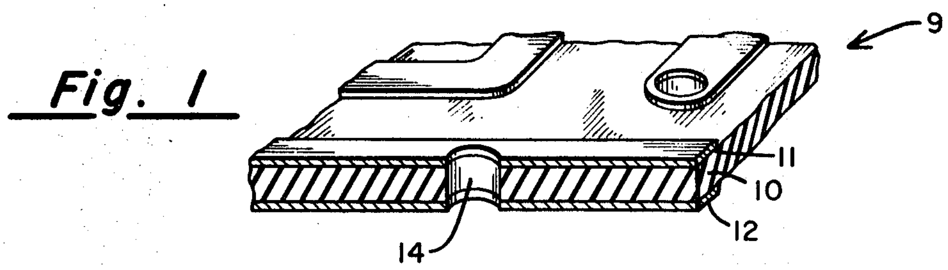
FIG. 1 is a pictorial perspective view, in section, of a pair of conducting members separated by an insulating layer.

Referring to the drawings, FIG. 1 shows a double-sided circuit 9 having an insulated layer 10 with a first electrical conductor 11 located on the top side and a second electrical conductor 12 located on the bottom side of insulating layer 10. Insulating layer 10 maybe either flexible or rigid and can be made from a variety of materials marketed under trademarks such as Mylar, Kapton or the like. Located in electrical conductor 11, insulating layer 10 and electrical conductor 12 is a cylindrical hole 14. Although the preferred embodiment is shown with a hole all the way through it should be understood that it is also possible to have a hole which extends only through the insulating layer. With this approach the through hole connector is completed according to the present invention and then the surface electrical conductors are formed directly over the connector and in electrical contact with the compressed powdered metal layer.

Figure 2:
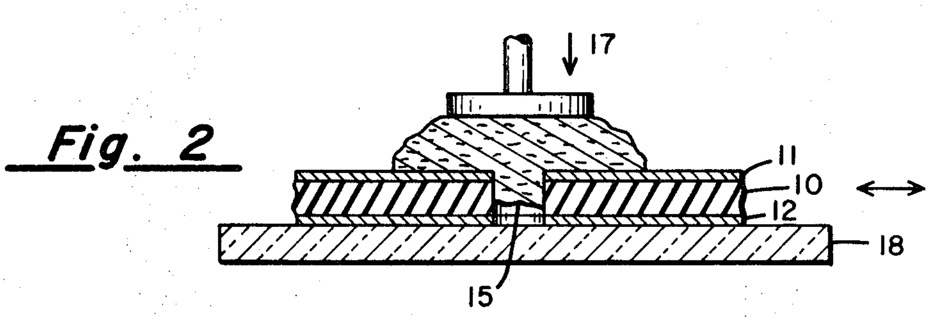
FIG. 2 is an end view showing the adhesive impregnated with a conductor being forced into the opening through the insulated layer between the conducting layers.

FIG. 2 shows the first step in making an electrical connection from conductor 11 to conductor 12 through insulating layer 10. The circuit is placed on a relatively flat luminescent surface 18 and then oscillated in a horizontal plane as an adhesive impregnated with an electrical conductor 15 is forced into opening 14 by a ram 17. Luminescent surface 18 permits an easy visual inspection of the hole to ensure that it is filled with material. Although a number of conductive adhesives could be used to produce an electrical connection from lead to lead, a silver-epoxy-conductive adhesive marketed under the trade name Tra-Duct 2902 has been found to produce excellent results. Typically, this adhesive comprises a nonconductive epoxy which has been impregnated with a conductive substance such as silver powder to produce a conductive adhesive.

The means of forcing the conductive adhesive into the opening can vary, however, it should be forced into opening 14 with a device that can exert sufficient pressure to force the adhesive into hole 14. The horizontal oscillation of the circuit prevents the adhesive from adhering to surface 18 and also allows air to escape as the adhesive 15 is forced into opening 14. After forcing conductive adhesive into opening 14, a wiper 20 is pulled along the top of conductor 11 to wipe off excessive material as shown in FIG. 3.

Figure 4:
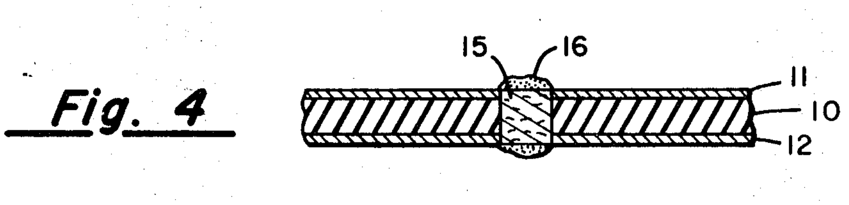
FIG. 4 is an end view showing the adhesive with a layer of powdered metal material located on the opposite ends of the connector.
Figure 5:
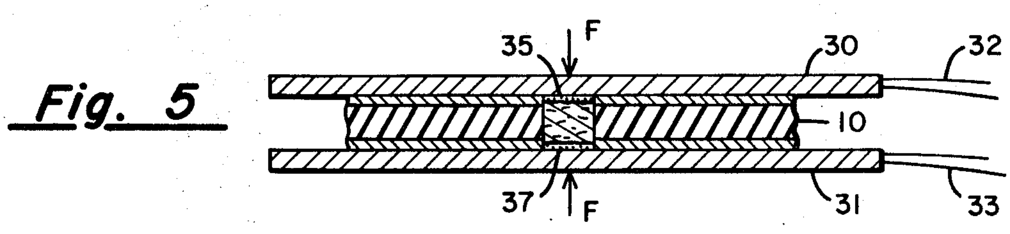
FIG. 5 shows the adhesive and the layers of powder being compressed between a pair of heating platens.
Figure 6:
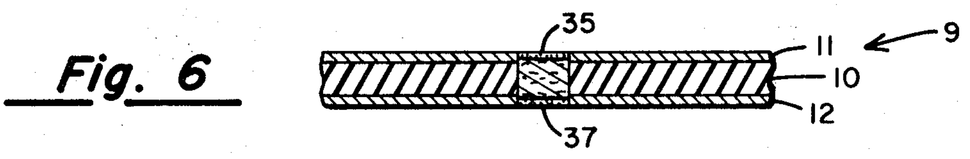
FIG. 6 shows the finished product.

In the next step, before the conductive adhesive can cure, a powdered metal such as silver powder is sprinkled on the top and bottom of the conductive adhesive as shown in FIG. 4. To form a granular solid layer across the ends of the adhesive in hole 14, the board is placed into a press where a heating platen 30 and a heating platen 31, which are heated respectively through leads 32 and 33, are compressed together to force the powder into the adhesive and form solid silver layers 35 and 37 in contact with leads 11 and 12. At the same time the adhesive is forced outward against the sides of hole 14 to ensure a tight fit and cured by the heat. Typically, the curing temperature is approximately 200° F. for half an hour and the pressure exerted on the circuit is approximately 4,000 p.s.i. After this step is completed the heating platens are removed and the circuit appears in a cured condition as shown in FIG. 6. Since the pressure is applied before the epoxy is cured the layers of powder are pressed into metal to metal contact with the conducting powder in the adhesive so as to produce a good electrical connection.

Figure 3:
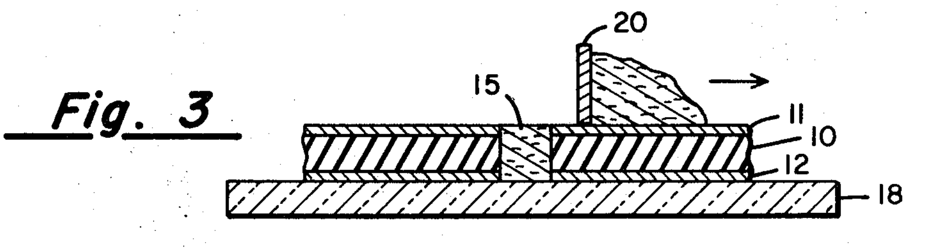
FIG. 3 is an end view showing the excess adhesive material being removed.

After the completion of the step shown in FIG. 3, i.e., the wiping of the excess conductive adhesive from the top surface of lead 11, the operator can visually inspect the circuit to determine if the interconnection lead has been formed properly. If light shines through hole 14 from luminescent table 18, it is an immediate visual indication to the operator that the conductive adhesive has been properly formed or forced into opening 14. This may be due to improper etching of hole 14 or insufficient adhesive being forced into opening 14. Thus, an operator can immediately note that opening 14 is improperly filled and can then easily clean out opening 14 because the adhesive has not set. The operator then forces new adhesive into opening 14 to repair the circuit.

While the present invention has been shown and described in regard to a single opening for purposes of clarity in understanding the process, there is no intention to limit the present method to a single filling and forming of an interconnection lead. In a typical circuit there are hundreds of openings that are filled and formed simultaneously.

I claim:

1. A laminate suitable for use in an electrical circuit comprising: a layer of insulated material; a first conducting member located on one side of said layer of material; a second conducting member located on the opposite side of said layer of material; a plastic material impregnated with a conductive substance to produce an electrical conductor, said conductor extending through said insulated layer and said first and second conducting members; and a solid layer of compressed electrically conducting metal powder located on each of the ends of said conductor in contact with the conducting members, said layers of powder coacting with said conductor to form a conducting path between said conducting members.

2. The invention as described in claim 1 wherein said plastic material comprises a hard-setting epoxy adhesive.

3. The invention as described in claim 2 wherein said layer of powder on the ends of said electrical conductor comprises silver.

4. A method of making an electrically conductive bond between conductors located on opposite sides of an insulated layer comprising the steps of:

a. Forming an opening through the insulated layer and the conductors;
b. forcing a hard-setting plastic conductive material into the opening;
c. removing excess plastic conductive material from the opening;
d. compressing conductive metal powder into a substantially solid layer over each end of the opening and into contact with the respective conductor on opposite sides of said insulating layer; and
e. curing the plastic conductive material.

5. The process as described in claim 4 wherein the step of forcing a hard-setting conductor into the opening comprises forcing epoxy resin impregnated with silver into the opening.

6. The process of claim 5 including the step of curing the plastic conductive material while it is being compressed.

7. The process of claim 6 including the step of oscillating the insulated layer as the conductive material is forced into the openings.